US012557233B2

(12) United States Patent
Lim et al.

(10) Patent No.: US 12,557,233 B2
(45) Date of Patent: Feb. 17, 2026

(54) INTERCONNETING ELECTRICAL MODULES

(71) Applicant: Crestron Electronics, Inc., Rockleigh, NJ (US)

(72) Inventors: Michelle Jo Anne Lim, Little Ferry, NJ (US); Stan Wisniewski, Pompton Plains, NJ (US)

(73) Assignee: Crestron Electronics, Inc., Rockleigh, NJ (US)

( * ) Notice: Subject to any disclaimer, the term of this patent is extended or adjusted under 35 U.S.C. 154(b) by 294 days.

(21) Appl. No.: 18/239,852

(22) Filed: Aug. 30, 2023

(65) Prior Publication Data

US 2025/0081378 A1    Mar. 6, 2025

(51) Int. Cl.
| | |
|---|---|
| *H05K 7/14* | (2006.01) |
| *H01R 12/72* | (2011.01) |
| *H01R 13/514* | (2006.01) |
| *H01R 13/518* | (2006.01) |

(52) U.S. Cl.
CPC ......... *H05K 7/1474* (2013.01); *H01R 12/727* (2013.01); *H01R 13/514* (2013.01); *H01R 13/518* (2013.01)

(58) Field of Classification Search
CPC  H01R 13/514; H01R 13/518; H01R 13/7032; H01R 31/08; H01R 31/085; H01R 12/727; H05K 7/1474
USPC .............................. 439/540.1, 507, 511, 513
See application file for complete search history.

(56) References Cited

U.S. PATENT DOCUMENTS

| | | | |
|---|---|---|---|
| 4,591,228 A | 5/1986 | Vasseur | |
| 5,049,089 A * | 9/1991 | Koenig | H05K 3/363 |
| | | | 439/493 |
| 5,207,601 A | 5/1993 | Vasseur et al. | |
| 5,775,955 A * | 7/1998 | Graube | H01R 9/2658 |
| | | | 439/716 |

(Continued)

FOREIGN PATENT DOCUMENTS

| | | | | |
|---|---|---|---|---|
| CN | 1862883 A | * | 11/2006 | ........... H01R 4/4828 |
| DE | 102010009805 A1 | * | 9/2011 | ......... H01R 13/7032 |
| WO | WO-2014019663 A1 | * | 2/2014 | ........... H01R 9/2675 |

OTHER PUBLICATIONS

Niko Home Control, Installation Manual, nv Niko, Oct. 2020, available at https://www.homecontrol.uk.com/wp-content/uploads/2020/10/PM-550-11.pdf.

*Primary Examiner* — Gary F Paumen
(74) *Attorney, Agent, or Firm* — Crestron Electronics, Inc.

(57) ABSTRACT

Systems, methods, and modes for mechanically and electrically interconnecting a plurality of electrical modules mounted on a rail side by side via an interconnector. Each electrical module comprises a housing and at least one slotted port recessed in the housing having a plurality of electrical contact pins therein. The interconnector comprises a first portion and a second portion each having a plurality of electrical contact pads, wherein each contact pad in the first portion is electrically connected to respective one of the plurality of contract pads in the second portion. The interconnector is adapted to removably attach to the electrical modules by inserting the first and second portions into respective slotted ports in the electrical modules and thereby aligning and electrically connecting the contact pads of the interconnector with respective contact pins of the electrical modules.

20 Claims, 8 Drawing Sheets

(56) References Cited

U.S. PATENT DOCUMENTS

| | | | |
|---|---|---|---|
| 6,172,875 B1 | 1/2001 | Suzuki et al. | |
| 6,418,027 B1 | 7/2002 | Suzuki et al. | |
| 7,059,898 B2 | 6/2006 | Barile | |
| 8,597,037 B2 | 12/2013 | Halim et al. | |
| 9,099,826 B2 * | 8/2015 | Nichols | H01R 31/08 |
| 9,276,349 B2 | 3/2016 | Yoshida et al. | |
| 10,292,295 B2 * | 5/2019 | Dall'Aglio | H05K 7/1465 |

* cited by examiner

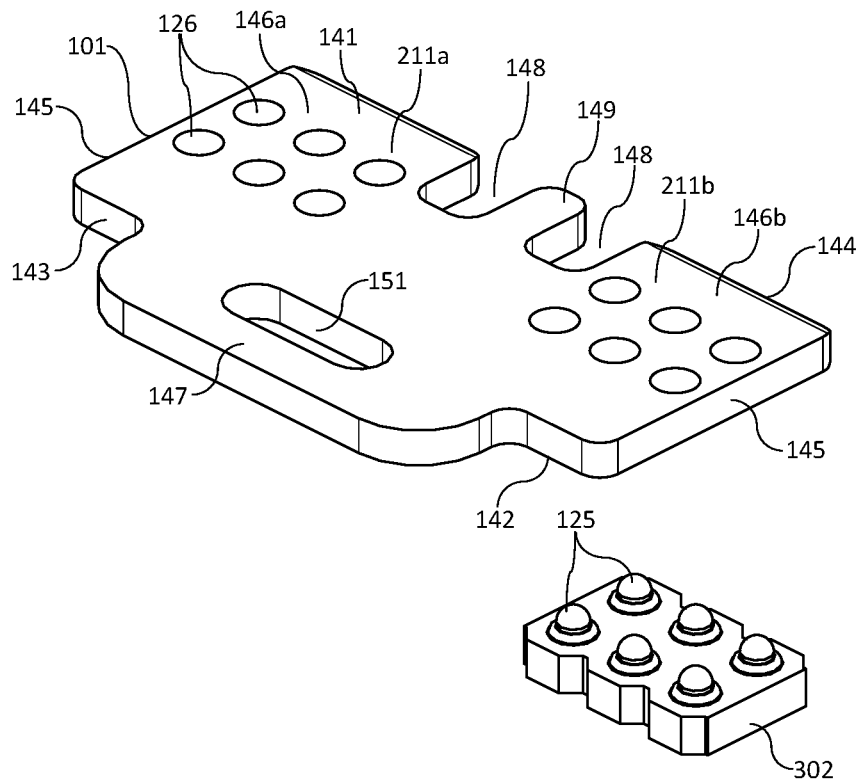
FIG. 4
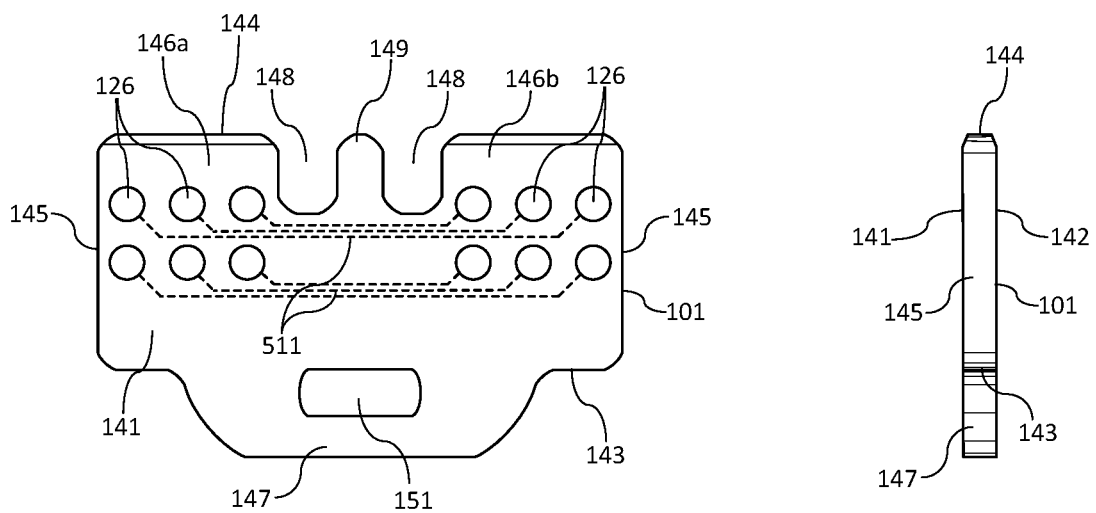
FIG. 5
FIG. 6

INTERCONNETING ELECTRICAL MODULES

BACKGROUND OF THE INVENTION

Technical Field

Aspects of the embodiments generally relate to electrical modules, and more specifically to mechanically and electrically interconnecting a plurality of electrical modules.

Background Art

Electrical modules are used in electrical enclosures for providing control of electrical equipment and may comprise circuit brakers, relays, dimmers, programmable control processors, motor controllers, network devices, or the like. Such modules are typically mounted on a metal rail, such as a standard DIN rail or the like, in a side-by-side configuration for easy installation and servicing. This installation type enables modular architecture that provides centralized, customizable, and flexible system design, for example, as part of a DIN rail automation system.

To complete installation, electrical modules need to be connected to power and in some cases to a communication network. These necessary connections are typically accomplished via wires. To reduce the amount of wires in electrical enclosures, interconnection mechanisms have been provided for electrically interconnecting adjacent modules, for example via sliding mechanisms. However, these type of connections are either limited to the number and/or types of connections that can be achieved and are insufficient in mechanically interconnecting the modules such that the modules are prone to being disengaged and losing electrical connection.

Accordingly, there is a need for systems, methods, and modes for mechanically and electrically interconnecting a plurality of electrical modules that enables secure power and/or network interconnection.

SUMMARY OF THE INVENTION

It is an object of the embodiments to substantially solve at least the problems and/or disadvantages discussed above, and to provide at least one or more of the advantages described below.

It is therefore a general aspect of the embodiments to provide systems, methods, and modes for mechanically and electrically interconnecting a plurality of electrical modules that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

DISCLOSURE OF INVENTION

According to one aspect of the embodiments, a system is provided for connecting a pair of electrical modules mounted on a rail side by side via an interconnector. Each electrical module comprises a housing and at least one slotted port recessed in the housing, wherein each slotted port comprises a plurality of electrical contact pins therein. The interconnector comprises a first portion and a second portion each having a plurality of electrical contact pads, wherein each contact pad in the first portion is electrically connected to respective one of the plurality of contract pads in the second portion. The interconnector is adapted to removably attach to the pair of electrical modules by inserting the first and second portions into respective slotted ports in the pair of electrical modules and thereby aligning and electrically connecting the contact pads of the interconnector with respective contact pins of the pair of electrical modules.

According to an embodiment, at least one of the pair of electrical modules is adapted to connect to a power source and transmit power to the other one of the pair of electrical modules via the interconnector. According to an embodiment, at least one of the pair of electrical modules comprises a communication interface and is adapted to transmit data signals to the other one of the pair of electrical modules via the interconnector. According to yet another embodiment, the pair of electrical modules receive and transmit power and data signals via the interconnector.

According to an embodiment, each slotted port is formed in a corner of the housing. According to an embodiment, each housing comprises a pair of side walls connected by a plurality of lateral walls, wherein each slotted port is recessed in a corner formed between one of the pair of side walls and one of the plurality of lateral walls. Each slotted port may be formed between a recessed edge in one of the pair of side wall and a recessed edge in one of the plurality of lateral walls. The interconnector may comprise a pair of notches, wherein the interconnector is inserted into the slotted ports until the recessed edges of the pair of side walls abut the notches of the interconnector. According to an embodiment, when the pair of electrical modules are adjacently disposed on the rail, the side walls distal to the rail are spaced apart forming a space therebetween, wherein the pair of notches of the interconnector form a projection therebetween, wherein the interconnector is inserted into the slotted ports until the recessed edges of the pair of side walls abut the notches of the interconnector and the projection is disposed in the space. The pair of side walls may be sloped such that when the pair of electrical modules are adjacently disposed on the rail, the side walls proximate to the rail abut each other, while the side walls distal to the rail are spaced apart forming the space therebetween. Each recessed edge in one of the plurality of lateral walls may comprise a ridge for guiding the interconnector into the slotted port.

According to an embodiment, the interconnector comprises a fork shaped edge that aligns and couples the electrical modules together. Each slotted port may comprise a top wall and a bottom wall, wherein the plurality of contact pins extend from the bottom wall. Pins may comprise spring-loaded pins such that the pins are adapted to compress fit with respect to the contact pads and push the interconnector against the slotted port to secure the interconnector in place. The first and second portions of the interconnector may comprise a tapered edge that guides the interconnector into the slotted ports. The interconnector may comprise a grip extending from its edge that protrudes from the housing when the interconnector is connected to the pair of electrical modules. According to an embodiment, the contact pads are electrically connected via a plurality of conductive traces. According to an embodiment, the interconnector comprises a printed circuit board.

According to another aspect of the embodiments, a first electrical module is provided comprising a housing adapted to be mounted on a rail next to a second electrical module, at least one slotted port recessed in the housing comprising a plurality of electrical contact pins therein, and an interconnector comprising a first portion and a second portion each having a plurality of electrical contact pads. Each contact pad in the first portion is electrically connected to respective one of the plurality of contract pads in the second portion. The interconnector is adapted to removably attach the first electrical module to the second electrical module by inserting the first portion into the slotted port of the first electrical module and inserting the second portion into a slotted port of the second electrical module, thereby aligning and electrically connecting the contact pads of the interconnector with respective contact pins of the first electrical module and respective contact pins of the second electrical module.

According to a further aspect of the embodiments, a system is provided for connecting a first and second electrical modules adapted to be mounted on a rail side by side via an interconnector. Each electrical module comprises a housing having a pair of side walls connected by a plurality of lateral walls, wherein each of the pair of electrical modules further comprise at least one slotted port recessed in a corner formed between one of the pair of side walls and one of the plurality of lateral walls, wherein each slotted port comprises an electrical module interface therein. The interconnector comprises a first portion and a second portion each having an interconnector interface disposed thereon, wherein the interconnector interface of the first portion is electrically connected to the interconnector interface of the second portion. The interconnector is adapted to removably attach to the pair of electrical modules by inserting the first portion into the slotted port of the first electrical module and inserting the second portion into the slotted port of the second electrical module and thereby aligning and electrically connecting the interconnector interface of the first portion with the module interface of the first electrical module and the interconnector interface of the second portion with the module interface of the second electrical module. According to an embodiment, each slotted port is formed between a recessed edge in one of the pair of side wall and a recessed edge in one of the plurality of lateral walls, wherein the interconnector comprises a pair of notches, wherein the interconnector is inserted into the slotted ports until the recessed edges of the pair of side walls abut the notches of the interconnector. According to an embodiment, the interconnector comprises a fork shaped edge that aligns and couples the side walls of the electrical modules together.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

BRIEF DESCRIPTION OF THE SEVERAL VIEWS OF THE DRAWINGS

Figure 1:
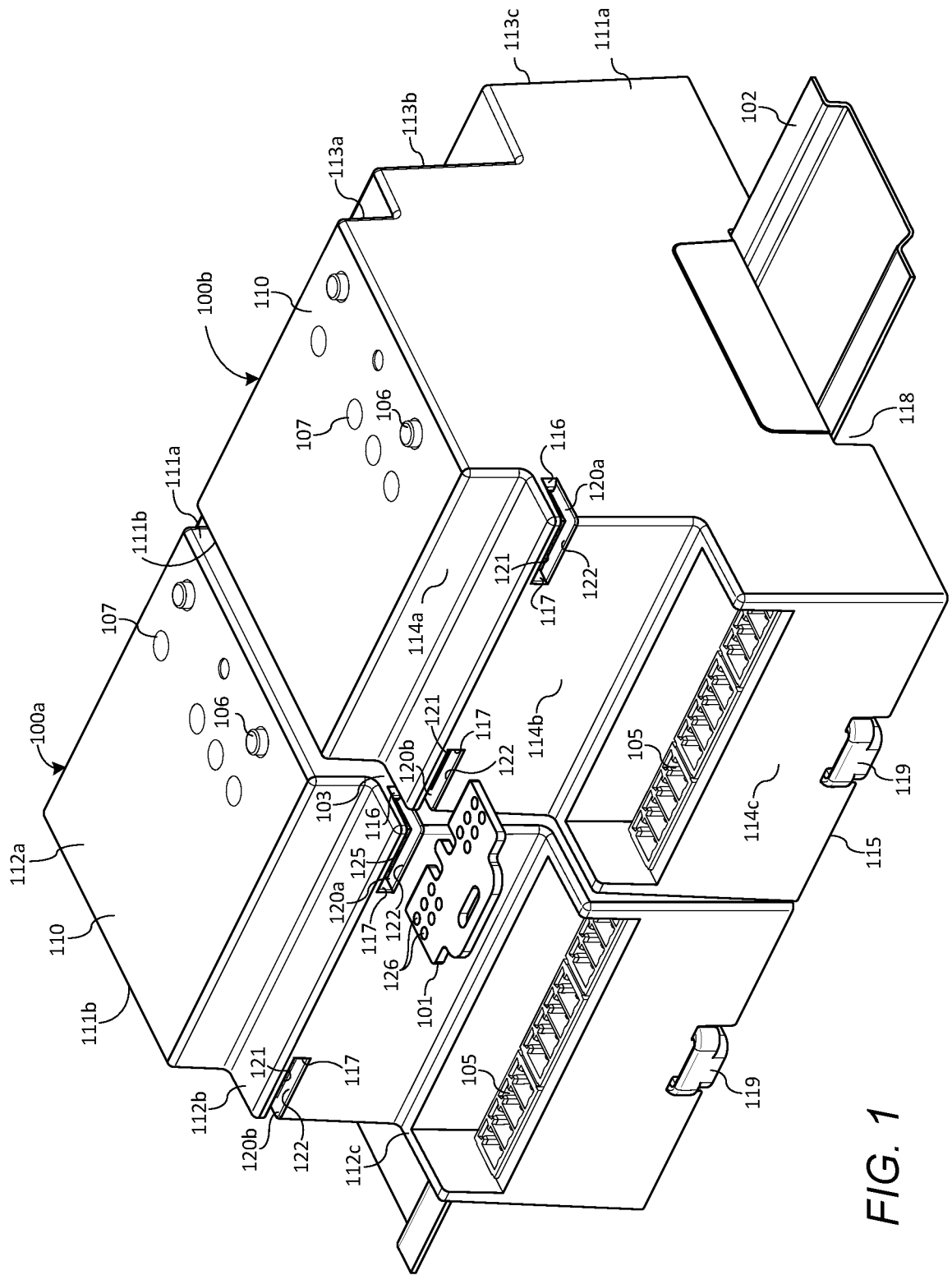

FIG. 1 illustrates a perspective view of a pair of adjacently disposed electrical modules and an interconnector according to an illustrative aspect of the embodiments.

Figure 2:
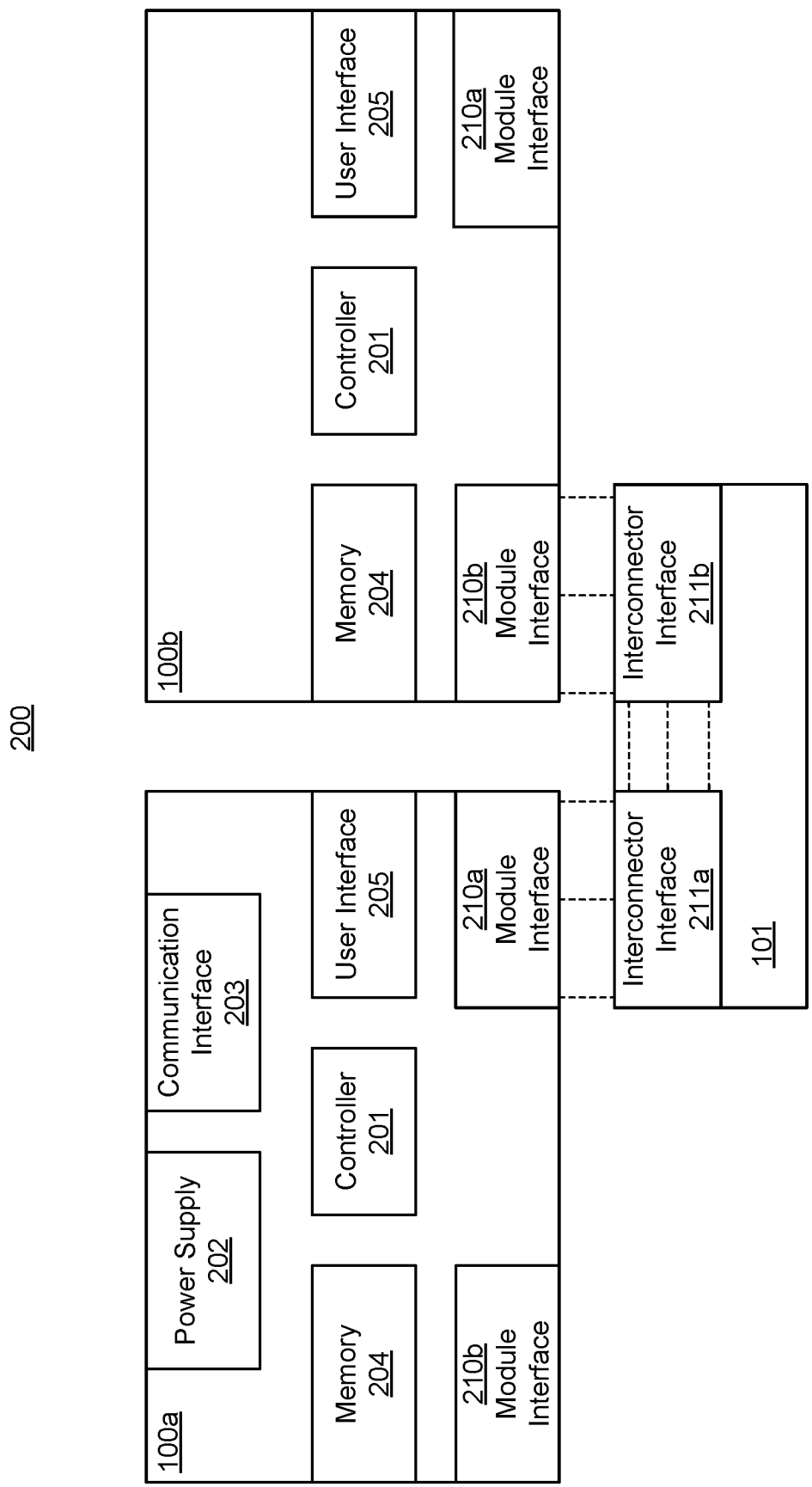

FIG. 2 shows an illustrative block diagram of the pair of electrical modules and the interconnector according to an illustrative aspect of the embodiments.

Figure 3:
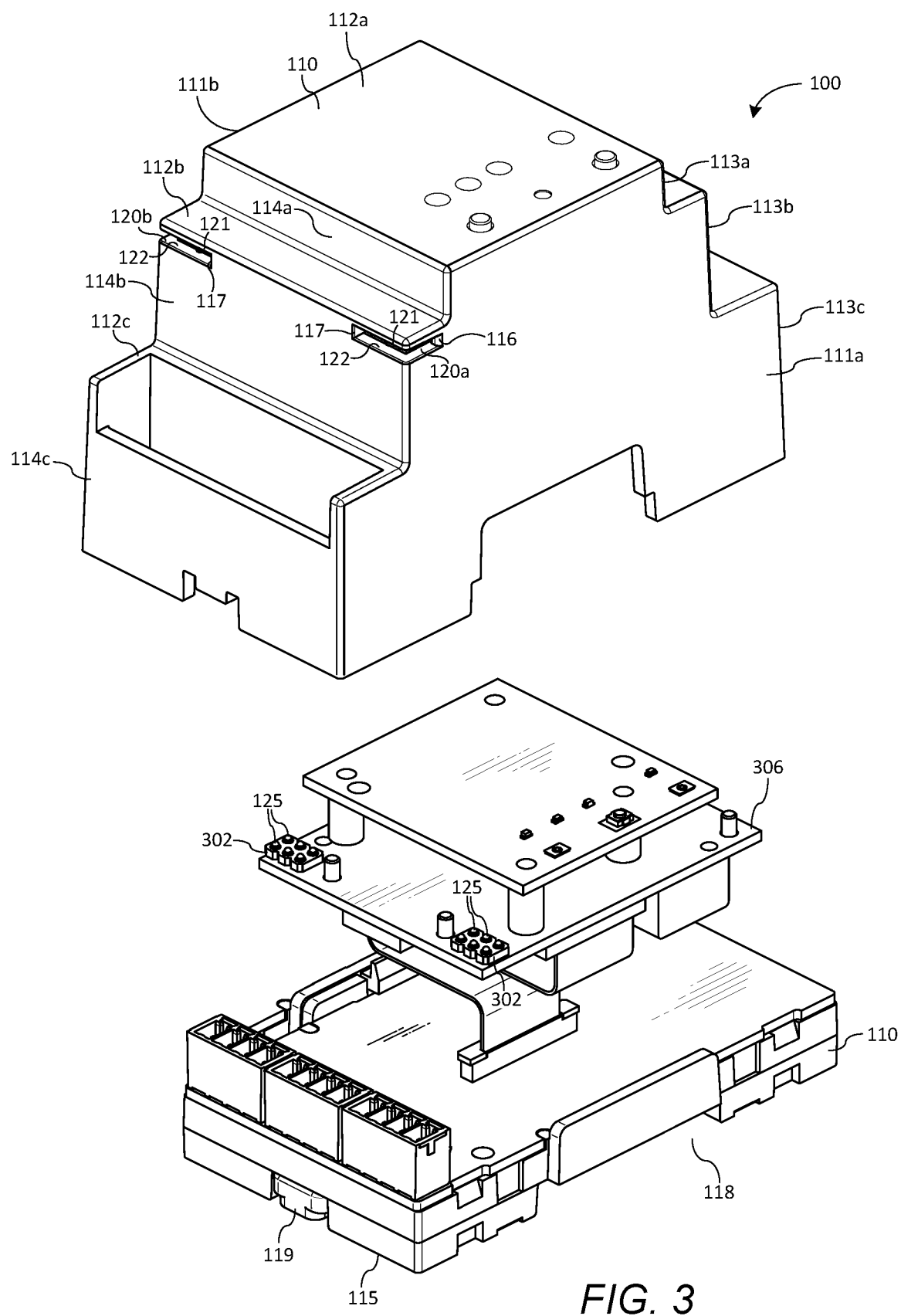

FIG. 3 illustrates an exploded perspective view of an electrical module according to an illustrative aspect of the embodiments.

FIG. 4 illustrates a perspective view of the interconnector and port block according to an illustrative aspect of the embodiments.

FIG. 5 illustrates a top view of the interconnector according to an illustrative aspect of the embodiments.

FIG. 6 illustrates a side view of the interconnector according to an illustrative aspect of the embodiments.

Figure 7:
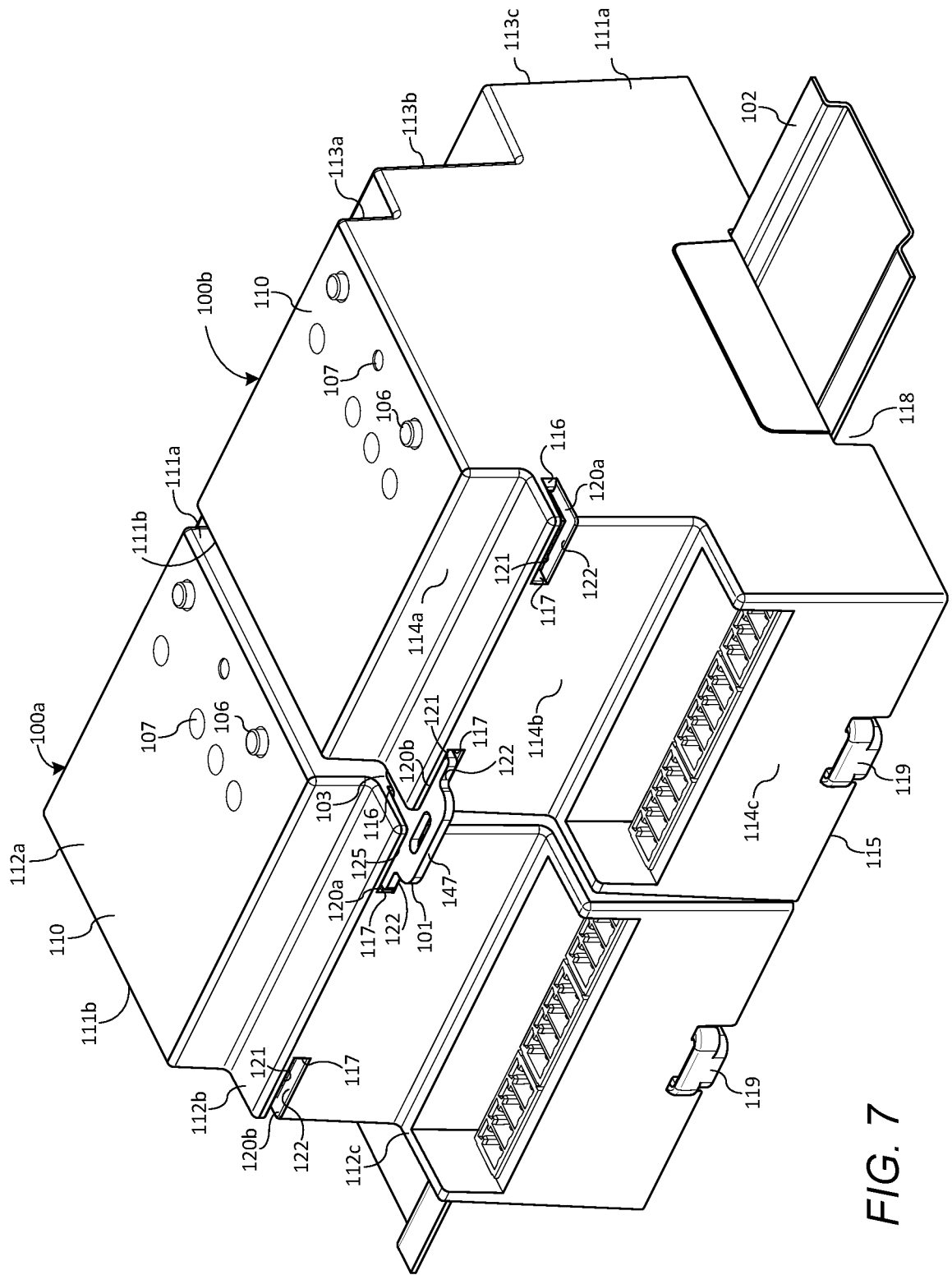

FIG. 7 illustrates a perspective view of the pair of adjacently disposed electrical modules interconnected via the interconnector according to an illustrative aspect of the embodiments.

Figure 8:
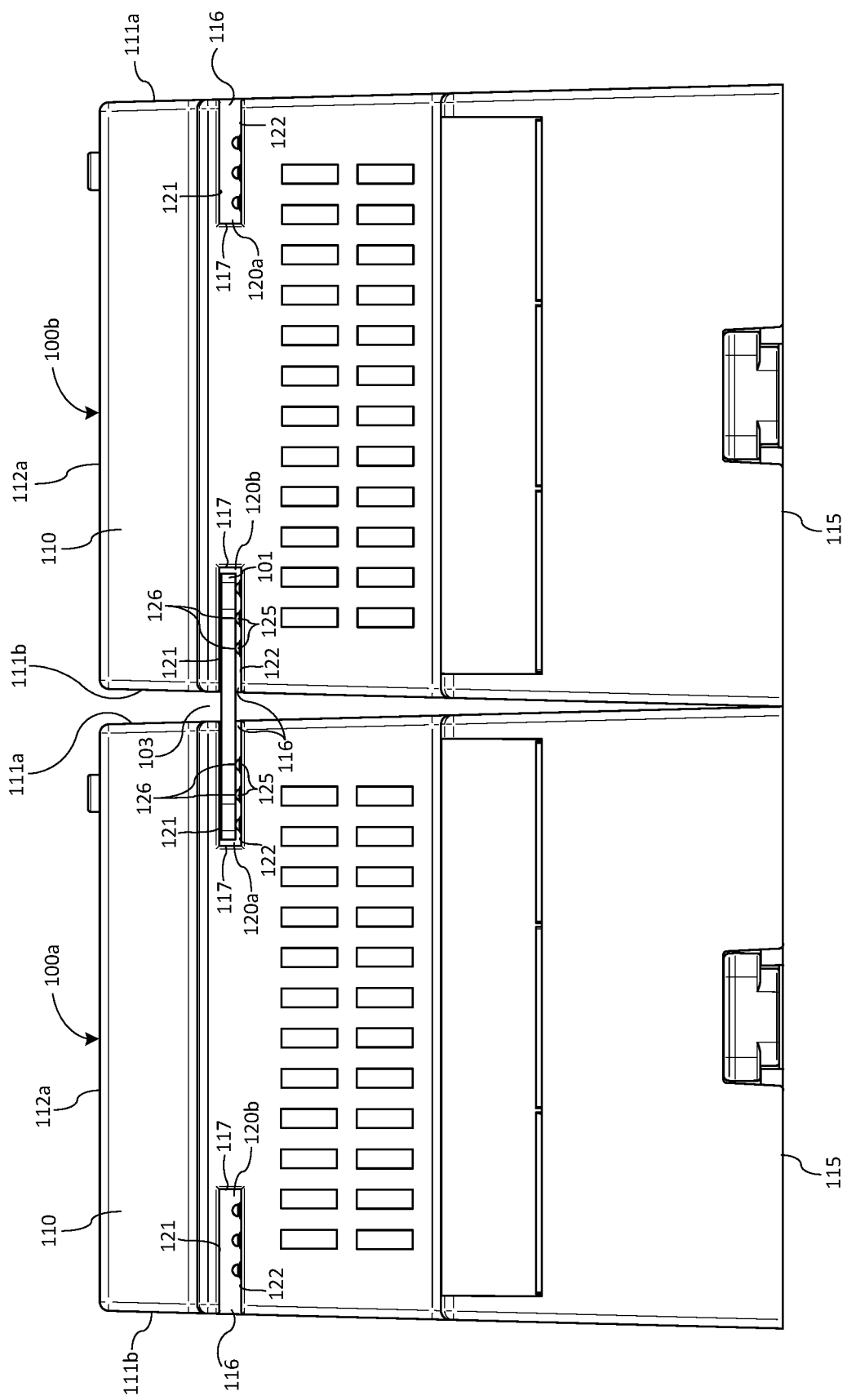

FIG. 8 illustrates a bottom view of the pair of adjacently disposed electrical modules interconnected via the interconnector according to an illustrative aspect of the embodiments.

Figure 9:
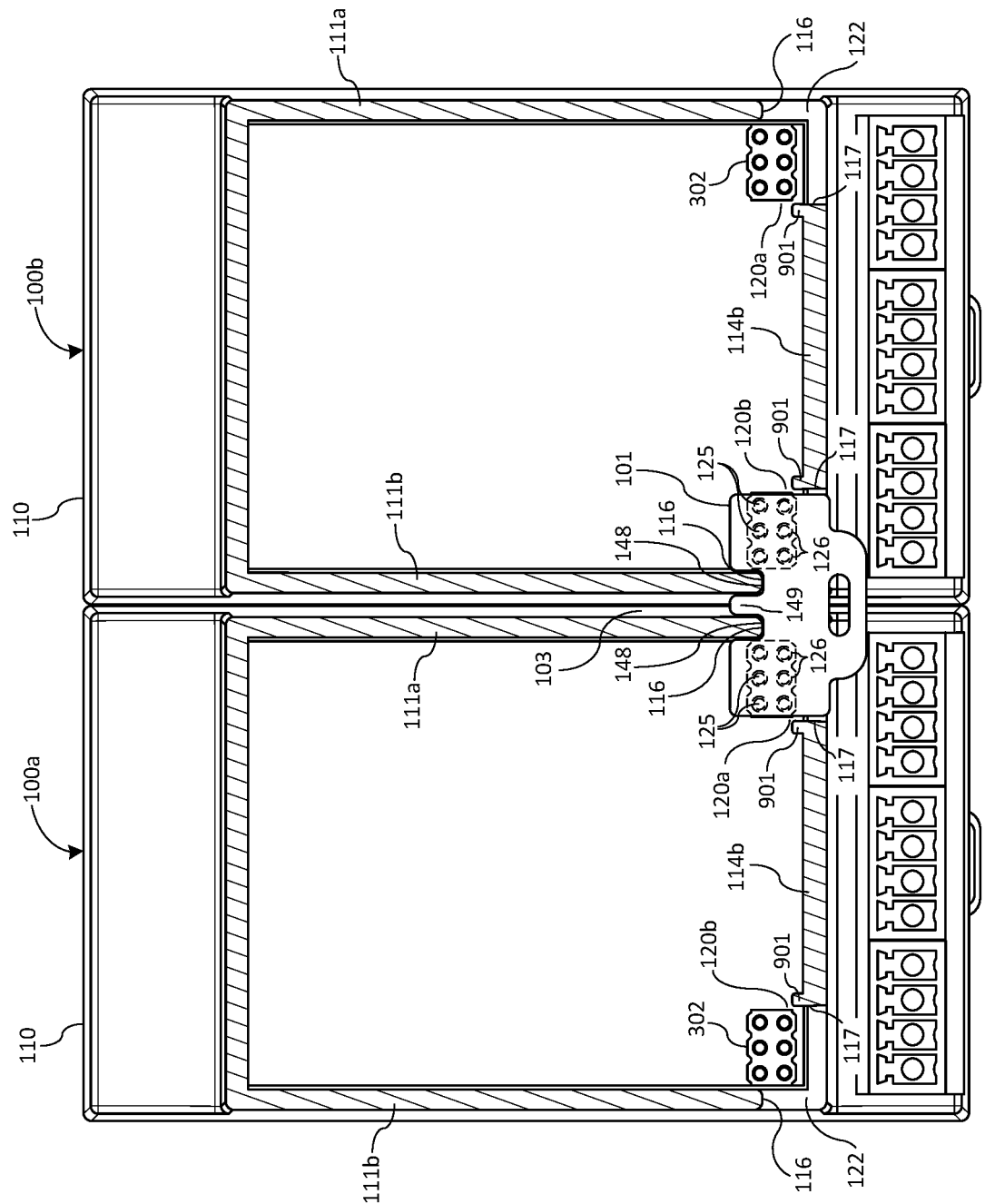

FIG. 9 illustrates a top cross section view of the pair of adjacently disposed electrical modules interconnected via the interconnector according to an illustrative aspect of the embodiments.

Figure 10:
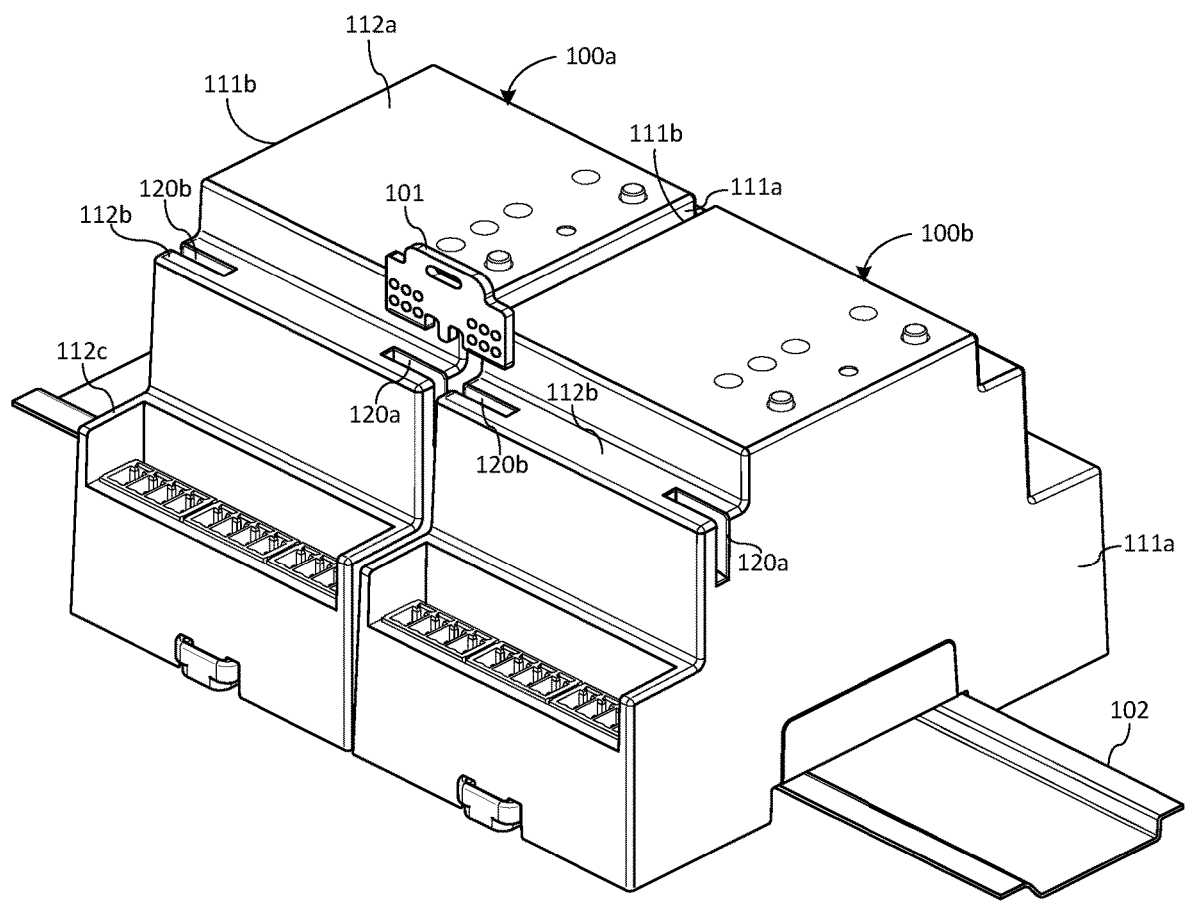

FIG. 10 illustrates a perspective view of a pair of adjacently disposed electrical modules and an interconnector according to another illustrative aspect of the embodiments.

DETAILED DESCRIPTION OF THE INVENTION

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices described herein.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.

| | |
|---|---|
| 100 | Electrical Module |
| 100a-b | Electrical Modules |
| 101 | Interconnector |
| 102 | Metal Rail |
| 103 | Space |
| 105 | Ports |
| 106 | Buttons |
| 107 | Light Indicators |
| 110 | Housing |
| 111a-b | Side Walls |
| 112a-c | Front Walls |
| 113a-c | Top Walls |
| 114a-c | Bottom Walls |
| 115 | Rear Wall |
| 116 | Recessed Edges |
| 117 | Recessed Edges |
| 118 | Channel |
| 119 | Rail Clips |
| 121 | Top Wall |
| 122 | Bottom Wall |
| 120a-b | Slotted Ports |
| 125 | Contact Pins |
| 126 | Contact Pads |
| 141 | Top Surface |
| 142 | Bottom Surface |
| 143 | Front Edge |
| 144 | Rear Edge |
| 145 | Side Edges |
| 146a-b | First and Second Portion |
| 147 | Grip |
| 148 | Notches |
| 149 | Projection |
| 151 | Cutout |
| 200 | Block Diagram |
| 201 | Controller(s) |
| 202 | Power Supply |
| 203 | Communication Interface |
| 204 | Memory(ies) |
| 205 | User Interface(s) |
| 210a-b | Module Interfaces |
| 211a-b | Interconnector Interfaces |
| 302 | Port Block |
| 306 | Printed Circuit Boards (PCB) |
| 511 | Conductive Lines |
| 901 | Ridge |

MODE(S) FOR CARRYING OUT THE INVENTION

The present embodiments provide systems, methods, and modes for mechanically and electrically interconnecting a plurality of electrical modules, but is not limited thereto, except as may be set forth expressly in the appended claims.

Referring to FIG. 1, there is shown a perspective view of a pair of adjacently disposed electrical modules 100a-b and an interconnector 101 for mechanically connecting the electrical modules 100a-b as well as to enable power and/or network interconnection without the need of additional wiring. Electrical modules 100a-b may be adapted for mounting on a metal rail 102, such as a standard DIN rail, a proprietary rail, or another modular attachment systems, within or outside of an electrical enclosure. An electrical module 100a-b may comprise various types of modules known in the art, including a control module, a network module, and/or a power module, such a general control processor, a lighting control processor, a shading control processor, a load controller, a power controller, a motor controller, a power supply, a dimmer, a relay, a switcher, a converter, a thermostat, a gateway, a splitter, a switch, a network bridge, an interface, a network access point, a router, or any combinations thereof. Electrical modules 100a-b may for example comprise a plurality of ports 105 for interfacing with various types of electronic devices or loads, including, but not limited to audiovisual (AV) equipment, lighting, shades, screens, computers, laptops, heating, ventilation and air conditioning (HVAC), security, appliances, and other equipment. Electrical modules 100 may be used in residential load control, or in commercial settings, such as classrooms, office buildings, hotels, or the like.

Referring to FIG. 2, there is shown an illustrative block diagram 200 of the pair of modules 100a-b and the interconnector 101. Electrical modules 100a-b may comprise identical configuration with the same components for performing the same functions, or they may comprise different types of modules with different component types for performing different types of function. In addition, although two modules 100a-b and a single interconnector 101 are illustrated, the present embodiments may comprise any number of modules and corresponding number of interconnectors that interconnect the modules to enable power and/or network interconnection. Electrical module 100a, for example, may comprise a controller 201, a power supply 202, a communication interface 203, a memory 204, a user interface 205, and a pair of module interfaces 210a-b. Module 100a may comprise fewer or additional components. Controller 201 can comprise one or more processors, microprocessors, "general purpose" or special purposes microprocessors, application specific integrated circuits (ASICs), or any combinations thereof. Controller 201 can provide processing capability to execute an operating system, run various applications, and/or provide processing for one or more of the techniques and functions described herein. Memory 204 can be communicably coupled to or may be integrated with the controller 201 and can store data and executable code. Memory 204 can represent volatile memory such as random-access memory (RAM), but can also include nonvolatile memory, such as read-only memory (ROM) or Flash memory.

Communication interface 203 may comprise a wired or a wireless communication interface configured for bidirectional communication with other devices over a communication network, for example for transmitting control commands to various connected loads or electrical devices and receiving feedback. Communication interface 203 may comprise one or more of the ports 105, that can represent, for example, an Ethernet port, a Cresnet® port, a COM port, a USB port, a DMX port, a DALI® port, a 0-10V low voltage dimming port, an RGBW control port, or the like. Communication interface 203 may in addition, or alternatively, comprise a wireless interface that can comprise one or more antenna and/or one or more transceivers, such as a radio frequency (RF) transceiver, an infrared (IR) transceiver, or other communication technologies known to those skilled in the art. Wireless interface 203 may be governed by proprietary or a standard protocol, such as for example, infiNET EX®, ZigBee®, Wi-Fi®, Z-Wave®, or other communication technologies known in the art. In yet another embodiment, wireless interface 203 may comprise a short range wireless interface, such as Bluetooth, near-field communication (NFC), RFID, or the like, for wireless communication with proximately located wireless device, such as a mobile device, a smartphone, a tablet, a portable computer, or other portable electronic devices known in the art.

Power supply 202 may be configured to connect to a power source through a terminal block, electrical wires, or the like. Module 100a may be powered by an electric alternating current (AC) power signal from an AC mains power source, such as a 120V or 240V AC power source, or by a low voltage power source, such as 24 V AC power source, among other AC voltage levels, or from a direct current (DC) power source, such as a 12V, 18V, or 24V DC power source, among other DC voltage levels. In yet another embodiment, module 100a can both receive electric power and data signals from a communication network using Power-over-Ethernet (PoE) or via a Cresnet® port. According to another embodiment, module 100a can further comprise a user interface 205, such as in the form of buttons 106 to provide user commands to the controller 201a, and/or one or more light indicators 107 such as multicolor light emitting diodes (LED) for indicating status.

Module 100a may further comprise at least one module interface, such as in the form of a plurality of contact pins 125 discussed below. For example, module 100a may comprise a pair of module interfaces 210a-b. Module 100b may for example comprise similar components as module 100a, or it may comprise fewer components as shown in FIG. 2, such as a controller 201, memory 204, user interface 205, and module interfaces 210a-b as discussed above. Each module interface 210a-b of electrical modules 100a-b are adapted to removably interface with an interconnector 101, as described below, to transmit and/or receive power and/or data signals. Interconnector 101 may comprise a pair of interconnector interfaces 211a-b, for example in the form of a plurality of contact pads 126 as further discussed below. The pair of interconnector interfaces 211a-b are electrically connected to each other to transmit and/or to receive power and/or data signals. To interconnect the modules 100a-b, interconnector interface 211a electrically interfaces with module interface 210a of electrical module 100a while interconnector interface 211b electrically interfaces with module interface 210b of electrical module 100b, as further discussed below. Once connected by interconnector 101, electrical module 100a comprising a power supply 202 and communication interface 203 may transmit power and/or data signals to electrical module 100b through module interfaces 210a-b and the interconnector 101. Additional modules can be connected to module 100a and/or module 100b via their second set of module interfaces (i.e., module interface 210b of electrical module 100a and/or module interface 210a of electrical module 100b) and one or more additional interconnectors 101 to receive power and/or data signals. According to an alternative embodiment, the module interfaces 210a-b may comprise the contact pads 126 and the interconnector 101 may comprise contact pins 125.

Referring to FIG. 3, there is shown an exploded perspective view of an electrical module 100. Each electrical module 100 may comprise a housing 110 for housing one or more electrical components therein, such as one or more printed circuit boards (PCB) 306 comprising the electrical components describe above. Housing comprise one or more portions made of plastic, metal, fiberglass, composite, or other materials known in the art, or any combinations thereof. Housing 110 may comprise a pair of side walls 111a-b connected by a plurality of lateral walls 112-115. As an example, lateral walls may include one or more front walls 112a-c, one or more top walls 113a-c, one or more bottom walls 114a-c, and a rear wall 115. Although the housing 110 is shown as having a stepped design with a plurality of front walls 112a-c, top walls 113a-c, and bottom walls 114a-c, the housing 110 may comprise a single front wall, a single top wall, a single bottom wall, or any combinations thereof. The rear wall 115 may comprise a channel 118 adapted to receive and retain the metal rail 102 therein, via for example rail clips 119 or the like. As shown in FIG. 8, side walls 111a-b may be sloped such that when the pair of electrical modules 100a-b are adjacently disposed, the side walls 111a-b proximate to the rear wall 115 abut each other, while the side walls 111a-b distal to the rear wall 115 are spaced apart forming a space 103 therebetween.

Referring back to FIG. 3, housing 110 may further comprise a pair of oppositely disposed slotted ports 120a-b each sized and shaped to receive a portion of the interconnector 101. The slotted ports 120a-b may be recessed in the corners formed between and at least partially extending through one of the side walls 111a-b and one of the lateral walls 112-115. For example, slotted port 120a may be formed in a corner between side wall 111a and bottom wall 114b and slotted port 120b may be formed in the corner between side wall 111b and bottom wall 114b. Thereby, slotted ports 120a-b are formed between recessed edges 116 in side walls 111a-b and recessed edges 117 in lateral walls 114b, respectively. Each slotted port 120a-b may further comprise a top wall 121 and a bottom wall 122 extending between recessed edges 116 and 117, respectively. Each recessed edge 117 in each lateral wall 114b may further comprise a ridge 901 (FIG. 9) inwardly extending from the lateral wall 114b into the housing 110.

According to various embodiments, slotted ports 120a-b may be formed in other corners of housing 110, such as in the pair of corners between side walls 111a-b and bottom wall 114a, side walls 111a-b and bottom wall 114c, side walls 111a-b and top wall 113a, side walls 111a-b and top wall 113b, side walls 111a-b and top wall 113c, side walls 111a-b and front wall 112a, side walls 111a-b and front wall 112b, side walls 111a-b and front wall 112c, and any combinations thereof. For example, referring to FIG. 10, there are shown electrical modules 100a-b according to another embodiment with slotted ports 120a-b formed in the corners between side walls 111a-b and front walls 112b.

Referring to FIGS. 1 and 3, each slotted port 120a-b may house the module interface 210a-b, for example in the form of a plurality of contact pins 125 electrically conductive materials, such as metal. Pins 125 may extend inwardly within the slotted port 120a-b from the bottom wall 122 of the slotted port 120a-b and may contain a low profile with a stroke length of 0.024", although other size may be used. Although pins 125 can alternatively extend inwardly from the top wall 121 of the slotted port 120a-b. Pins 125 can be in the form of spring-loaded pins, commonly referred to as "pogo-pins", so that they can be kept in a compressive fitting with contact pads 126 of the interconnector 101. Pins 125 may be disposed on a port block 302 (see also FIG. 4) that may be connected to one of the PCB 306 within the housing to receive and/or transmit power and/or data signals. Although, pins 125 may be individually connected to the PCB 306. Pins 125 can have different sized springs with different spring constants, meaning that different amounts of force are required to compress them. In addition, such pins can have a number of different lengths, diameters, shapes, and head designs (the head being the portion that makes electrical contact), and can be rated for different amounts of voltage and current. Pins 125 may be connected to the PCB 306 to provide power and/or data signals. Pins 125 may be arranged in a matrix, of two three pin rows for example, although they may be instead linearly arranged. According to an embodiment, six sets of pins 125 may be provided, although other number of pins 125 may be provided depending on the electric device specifications. For example, pins 125 may be associated with a hot, neutral, and/or ground power signals, as well as a plurality of data signals.

Referring further to FIGS. 4-6, where FIG. 4 illustrates a perspective view of the interconnector 101 and port block 302, and FIGS. 5-6 illustrates a top view and a side view of the interconnector 101, respectively. Interconnector 101 may be made of non-conductive rigid material, such as plastic, fiberglass, composite material, or other materials known in the art. According to an embodiment, interconnector 101 may comprise a PCB board. Interconnector 101 may be generally rectangular in shape and may comprise a top surface 141 and a bottom surface 142 interconnected by a front edge 143, a rear edge 144, and a pair of side edges 145. The interconnector 101 may comprise a grip 147 extending from the front edge 143 for allowing a user to grip the interconnector 101 when inserting or disengaging the interconnector with respect to the slotted ports 120a-b. Grip 147 may comprise an oblong shaped cutout 151 or a recess that allows the interconnector to be easily removed with a tool, such as a flat screw driver. The rear edge 144 may be tapered or chamfered and may comprise a cutout "fork" feature having a pair of notches 148 that form a projection 149 therebetween. Notches may comprise a U-shape, a squared shape, or a similar shape such that they can receive the width of the side walls 111a-b therein. The interconnector 101 may comprise a first portion 146a and a second portion 146b spaced apart by the pair of notches 148 such that each portion 146a-b is formed between a respective side edge 145 and a respective notch 148 of the interconnector 101. The first portion 146a may comprise the first interconnector interface 211a and the second portion 146b may comprise the second interconnector interface 211b disposed on the top surface 141 and/or the bottom surface 142. Each interconnector interface 211a-b comprises a plurality of contact pads 126 made of electrically conductive material. The number and positioning of the contact pads 126 corresponds to the number and positioning of the contact pins 125. Each contact pad 126 in the first interconnector interface 211a is electrically connected to a contact pad 126 in the second interconnector interface 211b, for example via a conductive line or a trace 511. Traces 511 may be exposed, or as shown in FIG. 5, they may be encased inside the PCB or sandwiched between a plurality of PCBs.

Referring to FIGS. 7-9, there is shown a perspective view, a bottom view, and a top cross section view of the pair of adjacently disposed electrical modules 100a-b interconnected via the interconnector 101. During installation, the pair of electrical modules 100a-b may be secured to the metal rail 102 via rail clips 119 in a side-by-side configuration where the side walls 111a-b proximate to the rear wall 115 abut each other as shown in FIG. 1. Before applying any power to electrical modules 100a-b, the interconnector 101 is inserted into the slotted ports 120a-b to secure the electrical modules 100a-b to each other as well as to enable electrical interconnection as shown in FIG. 7. Particularly, the interconnector 101 can be gripped via grip 147 and inserted by sliding the first and second portions 146a-b into slotted ports 120a-b of the first and second electrical modules 100a-b, respectively. The taper in the rear edge 144 of the interconnector 101 assists in guiding and sliding the interconnector 101 into the slotted ports 120a-b between their top walls 121 and bottom walls 122. Ridges 901 of recessed edges 117 in lateral walls 114b also guide side edges 145 of the interconnector 101 into the slotted ports 120a-b such that the interconnector 101 is slid orthogonally and straight into the slotted ports 120a-b and does not wiggle or pivot therein. This assists in the slotted ports 120a-b receiving the first portion 146a and the second portion 146b of the interconnector 101 simultaneously such that its interfaces 211a-b make simultaneous contacts with the module interfaces 210a-b of the slotted ports 120a-b. The interconnector 101 is inserted until the recessed edges 116 of the side walls 111a-b abut the respective notches 148 in the interconnector 101 and the projection 149 is disposed in space 103 between the side walls 111a-b of the electrical modules 100a-b. The "fork" shaped edge, including notches 148 and projection 149, of interconnector 101 align and securely hold the two electrical modules 100a-b together in place, preventing the modules 100a-b from pulling apart and losing electrical connection when in use. When in position, the electrical contact pads 126 of interconnector interfaces 211a-b contact the respective electrical contact pins 125 of module interfaces 210a-b. The connector 101 is held in place inside the slotted ports 120a-b via friction fit formed by the spring loaded contact pins 125. The force of the pogo pin 125 acting towards the interconnector 101 pushes the interconnector 101 against the top wall 121 and secures it in place.

Power can then be applied to electrical module 100a and/or electrical module 100b. Data and/or power can then flow between the modules 100a-b from module interface 210a to module interface 210b via interconnector interfaces 211a-b, or vice versa. According to an embodiment, buttons 106 may be used to place the modules 100a-b in a test mode and light indicators 107 of modules 100a-b can indicate if the modules are powered and/or that the data connection is successful. When the connector 101 is fully inserted, grip 147 remains protruding from slotted ports 120a-b. Modules 100a-b can be disengaged by removing any power connection and by pulling on the grip 147 or inserting a tool into cutout 151 to leverage the interconnector 101 out of the slotted ports 120a-b.

INDUSTRIAL APPLICABILITY

To solve the aforementioned problems, the aspects of the embodiments are directed towards mechanically and electrically interconnecting a plurality of electrical modules that enables secure power and/or network interconnection. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

Additionally, the various methods described above are not meant to limit the aspects of the embodiments, or to suggest that the aspects of the embodiments should be implemented following the described methods. The purpose of the described methods is to facilitate the understanding of one or more aspects of the embodiments and to provide the reader with one or many possible implementations of the processed discussed herein. The steps performed during the described methods are not intended to completely describe the entire process but only to illustrate some of the aspects discussed above. It should be understood by one of ordinary skill in the art that the steps may be performed in a different order and that some steps may be eliminated or substituted.

All United States patents and applications, foreign patents, and publications discussed above are hereby incorporated herein by reference in their entireties.

Alternate Embodiments

Alternate embodiments may be devised without departing from the spirit or the scope of the different aspects of the embodiments.

What is claimed is:

1. A system for connecting a plurality of electrical modules comprising:
    a pair of electrical modules adapted to be mounted on a rail side by side, wherein each electrical module comprises a housing having a pair of side walls connected by a plurality of lateral walls and at least one slotted port recessed in a corner formed between one of the pair of side walls and one of the plurality of lateral walls of the housing, wherein each slotted port comprises a plurality of electrical contact pins therein; and
    an interconnector comprising a first portion and a second portion each having a plurality of electrical contact pads, wherein each contact pad in the first portion is electrically connected to respective one of the plurality of contract pads in the second portion;
    wherein the interconnector is adapted to removably attach to the pair of electrical modules by inserting the first and second portions into respective slotted ports in the pair of electrical modules and thereby aligning and electrically connecting the contact pads of the interconnector with respective contact pins of the pair of electrical modules.

2. The system of claim 1, wherein at least one of the pair of electrical modules is adapted to connect to a power source and transmit power to the other one of the pair of electrical modules via the interconnector.

3. The system of claim 1, wherein at least one of the pair of electrical modules comprises a communication interface and is adapted to transmit data signals to the other one of the pair of electrical modules via the interconnector.

4. The system of claim 1, wherein the pair of electrical modules receive and transmit power and data signals via the interconnector.

5. The system of claim 1, wherein each slotted port is formed between a recessed edge in one of the pair of side wall and a recessed edge in one of the plurality of lateral walls.

6. The system of claim 5, wherein the interconnector comprises a pair of notches, wherein the interconnector is inserted into the slotted ports until the recessed edges of the pair of side walls abut the notches of the interconnector.

7. The system of claim 6, wherein when the pair of electrical modules are adjacently disposed on the rail, the side walls distal to the rail are spaced apart forming a space therebetween, wherein the pair of notches of the interconnector form a projection therebetween, wherein the interconnector is inserted into the slotted ports until the recessed edges of the pair of side walls abut the notches of the interconnector and the projection is disposed in the space.

8. The system of claim 7, wherein the pair of side walls are sloped such that when the pair of electrical modules are adjacently disposed on the rail, the side walls proximate to the rail abut each other, while the side walls distal to the rail are spaced apart forming the space therebetween.

9. The system of claim 5, wherein each recessed edge in one of the plurality of lateral walls comprises a ridge for guiding the interconnector into the slotted port.

10. The system of claim 1, wherein the interconnector comprises a fork shaped edge that aligns and couples the electrical modules together.

11. The system of claim 1, wherein each slotted port comprises a top wall and a bottom wall, wherein the plurality of contact pins extend from the bottom wall.

12. The system of claim 1, wherein the pins comprise spring-loaded pins such that the pins are adapted to compress fit with respect to the contact pads and push the interconnector against the slotted port to secure the interconnector in place.

13. The system of claim 1, wherein the first and second portions of the interconnector comprise a tapered edge that guides the interconnector into the slotted ports.

14. The system of claim 1, wherein the interconnector comprises a grip extending from its edge that protrudes from the housing when the interconnector is connected to the pair of electrical modules.

15. The system of claim 1, wherein the contact pads are electrically connected via a plurality of conductive traces.

16. The system of claim 1, wherein the interconnector comprises a printed circuit board.

17. A first electrical module comprising:
    a housing adapted to be mounted on a rail next to a second electrical module, wherein the housing comprises a pair of side walls connected by a plurality of lateral walls;
    at least one slotted port recessed in a corner formed between one of the pair of side walls and one of the plurality of lateral walls of the housing, wherein the at least one slotted port comprises a plurality of electrical contact pins therein; and
    an interconnector comprising a first portion and a second portion each having a plurality of electrical contact pads, wherein each contact pad in the first portion is electrically connected to respective one of the plurality of contract pads in the second portion;
    wherein the interconnector is adapted to removably attach the first electrical module to the second electrical module by inserting the first portion into the slotted port of the first electrical module and inserting the second portion into a slotted port of the second electrical module, thereby aligning and electrically connecting the contact pads of the interconnector with respective contact pins of the first electrical module and respective contact pins of the second electrical module.

18. A system for connecting a plurality of electrical modules comprising:
a first electrical module and a second electrical module adapted to be mounted on a rail side by side, wherein each electrical module comprises a housing having a pair of side walls connected by a plurality of lateral walls, wherein each of the pair of electrical modules further comprise at least one slotted port recessed in a corner formed between one of the pair of side walls and one of the plurality of lateral walls, wherein each slotted port comprises an electrical module interface therein; and
an interconnector comprising a first portion and a second portion each having an interconnector interface disposed thereon, wherein the interconnector interface of the first portion is electrically connected to the interconnector interface of the second portion;
wherein the interconnector is adapted to removably attach to the pair of electrical modules by inserting the first portion into the slotted port of the first electrical module and inserting the second portion into the slotted port of the second electrical module and thereby aligning and electrically connecting the interconnector interface of the first portion with the module interface of the first electrical module and the interconnector interface of the second portion with the module interface of the second electrical module.

19. The system of claim 18, wherein each slotted port is formed between a recessed edge in one of the pair of side wall and a recessed edge in one of the plurality of lateral walls, wherein the interconnector comprises a pair of notches, wherein the interconnector is inserted into the slotted ports until the recessed edges of the pair of side walls abut the notches of the interconnector.

20. The system of claim 18, wherein the interconnector comprises a fork shaped edge that aligns and couples the side walls of the electrical modules together.

* * * * *